Feb. 28, 1950 A. KREITHEN 2,498,760

RADIO FREQUENCY POWER GENERATOR

Filed Nov. 30, 1946 2 Sheets-Sheet 1

INVENTOR.
ALEXANDER KREITHEN.
BY H. G. Grover
ATTORNEY.

Feb. 28, 1950 A. KREITHEN 2,498,760

RADIO FREQUENCY POWER GENERATOR

Filed Nov. 30, 1946 2 Sheets-Sheet 2

INVENTOR.
ALEXANDER KREITHEN.
BY
H. S. Grover
ATTORNEY.

Patented Feb. 28, 1950 2,498,760

UNITED STATES PATENT OFFICE 2,498,760

RADIO-FREQUENCY POWER GENERATOR

Alexander Kreithen, Philadelphia, Pa., assignor to Radio Corporation of America, a corporation of Delaware Application November 30, 1946, Serial No. 713,218

3 Claims. (Cl. 250—36)

Figure 1:
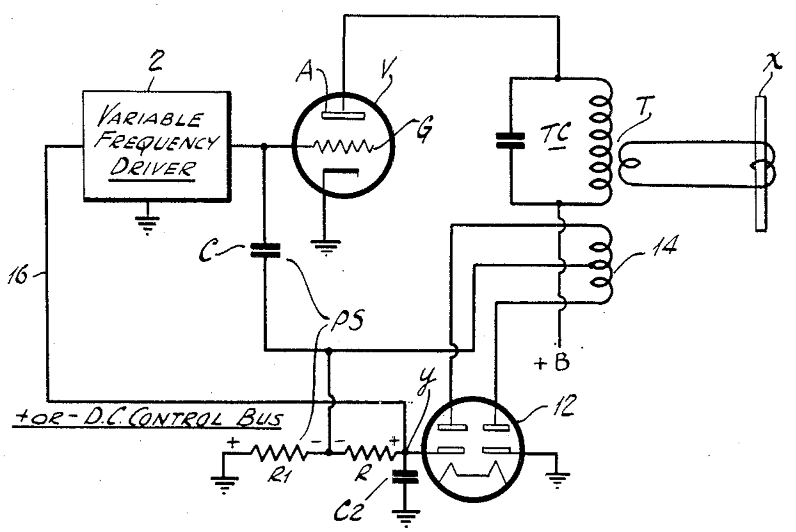

This application discloses an improved method and means for developing in a generator radio frequency power and has as its general object to provide a source of high frequency power capable of delivering power into a work load whose reactance may change during application of such power, and to include means for operating the generator under optimum conditions.

In some commercial applications, such as induction heating, it is necessary to use fixed tank circuit elements because at the power levels and frequency used, it is impractical to make the elements variable because of the size thereof and so forth. In working operation, the load impedance and reactance may vary; especially is this so when the power is used for induction heating equipment of high power and low radio frequencies. In such circumstances, where the load changes reactance, as, for instance, about the Curie point in steels, it is impossible to re-tune the tank components at powers on the order of 100 kilowatts or more and frequencies of 100 kc. or lower. The tank components then become power transformers and capacitors of such size that it is almost impossible to make the said components variable. This results in imperfect operation of the amplifier supplying the load. When a change occurs, the tank circuit is no longer a resistive load on the power amplifier tubes. This results in a displacement of the phase of the input and output currents and inefficient operation of the system.

Some radio frequency generators are known wherein the desired phase relation is re-established by tuning the output tank circuit elements. An example of such operation is illustrated in Beard et al. U. S. application, Serial #577,042, filed February 9, 1945, now Patent Number 2,469,324, dated May 3, 1949. This is a signal transmitter, not a generator of power for induction or dielectric heating applications. Moreover, in the Beard application, the output tank circuit is tuned by a variable capacitor in accordance with the difference in phase between output and input voltages. As pointed out above, it is impossible to tune the power amplifier tank circuit where power is being generated for dielectric or induction heating at high power and low frequency.

The primary object of my invention is to restore proper operating conditions in the power amplifier and do do so without tuning the output tank, which by necessity is fixed. In other words, the specific purpose of my invention is to provide means for re-tuning a load whose reactance may change, as the material being worked on passes through the Curie point, without re-tuning the tank circuit elements. This object is accomplished in accordance with my invention by producing an electrical variation representative of phase displacements between the power in the tank circuit and the power amplifier excitation voltage, and using this variation to re-tune the exciter to the resonant frequency of the tank circuit which may have changed. In known tuners, the antenna load is substantially fixed and remains fixed in operation. Such systems would not be useful for my purposes, where the load reactances are too big to make variable.

In describing my invention, reference will be made to the attached drawings, wherein:

Figs. 1, 2, 3 and 4 each illustrate diagrammatically and by circuit element and by circuit element connections the essential features of a power generator arranged in accordance with my invention. Each of the embodiments illustrated in these figures includes means for generating power for commercial uses and for returning the power amplifier excitation frequency to the resonant frequency of the output circuit's output impedance in case the work being acted on thereby changes the output circuit's resonance characteristic.

In Fig. 1, the power amplifier is represented by the tube V. As is known in practice, there may be a plurality of tubes in parallel and such is represented by the single tube V. The tube V has its control grid G excited by a variable frequency driver or exciter source 2 which may comprise an oscillation generator of controllable frequency and if desired, amplifiers and frequency multipliers. The anode A of the tube V is connected to a tuned tank circuit TC comprising, if desired, an inductor and capacitor in parallel, normally substantially tuned to parallel resonance at the frequency of the exciter source 2. The inductor of the circuit TC forms the primary winding of transformer T, the secondary winding of which is coupled by an inductor to the work X. The work X may comprise objects being passed through the working position in sequence. The load X is matched to the power amplifier tubes represented at V by a suitable transformer represented at T. The input reactance of the transformer plus the reactance reflected into the input side of the transformer by the impedance transformation is tuned as stated above by the fixed capacitor to the frequency desired, which may be as described above.

This frequency to which the tank circuit TC is tuned is determined by the type of load at X. In induction heating, for example, the frequency might be determined by the depth of penetration of heating desired. In heating dielectric materials, the voltage breakdown, the power factor and the size of the load may be some of the features governing the choice of frequency desired.

Obviously, the load or object X being worked on may be non-uniform due to manufacturing variations and so forth, in which case the tuning of the tank circuit TC will be changed, as will the phase of the voltage therein, so that the power amplifiers V will no longer be operating into a tuned impedance matched to the tube's output impedance. To correct this mis-matching, I supply an electronic phase detector comprising a tube 12 having its two anodes coupled to the ends of a winding 14, which may be on the transformer T. The winding 14 is center tapped and coupled to the output of the variable frequency driver 2 by condenser C. Thus, voltage is induced from the inductor of the tank circuit TC into the winding 14 and applied in push-pull (180°) relation to the anodes of the tube 12. The relative phase of these opposed voltages depends on the tank circuit tuning. At the same time, voltage from the source 2 is applied over R1 in parallel or push-push relation to the anodes of the tube 12. The condenser C and resistor R1 are such that these in-phase voltages on the anodes of tube 12 are displaced 90° with respect to the opposed voltages, supplied by winding 14, on these anodes when the exciter output voltage and tank TC voltage are of like frequency and phase, a condition which exists when the tank TC resonates at the exciter frequency. The tube 12 comprises a pair of diode rectifiers having a heated element and two indirectly heating cathodes, one of which is grounded and the other of which is connected to ground by a capacitor C2 and by resistors R and R1 in series. The resistors R and R1 are each in series in the direct current path of a different one of the diode rectifiers. As connected, the currents therethrough are in opposite directions and the potentials developed therein oppose and cancel when the tank circuit TC is resonant at the exciter frequency. Then the potential developed at Y is about zero. When the load reactance changes, the resonant point of the tank circuit also changes and one diode anode's phase of excitation by winding 14 is advanced, the other diode anode's phase of excitation is retarded and unequal currents flow in the resistors R and R1 to develop at Y a potential that is plus or minus, depending on whether the tank TC is above or below resonance. Thus, when the resonant frequency of the plate tank circuit TC is the same as the grid excitation frequency, the output of the phase detector is zero, since if current is produced the same is equal and in opposite directions through the rectifier loads so that no potential or substantially zero potential is produced at the point Y. The output of the phase detector is then zero and no control potential is supplied back over line 16 to change the frequency of the source in 2. If the two frequencies are not the same, the potential at Y is plus or minus, depending upon whether the grid frequency is above or below the resonant frequency of the power amplifier tank circuit TC. In Fig. 1, the D. C. paths are as follows: Starting with the left-hand anode of tube 12, the current flows through tube 12 to the cathode of the left-hand member, Y becoming positive with respect to the junction of R and R1, and then this current flows back through winding 14 to the anode. Starting with the right-hand anode of tube 12, the current flows through the tube to the cathode to ground, up from ground through R1, back to the junction of R1 and R and back to the right-hand anode of 12, through winding 14. The potential at Y to ground is the algebraic sum of the voltages across R1 and R.

The direct current potential appearing at Y is used to control the frequency of the driver stage 2, in any well known manner, such as through a reactance tube, so that the excitation to the input of the power amplifier stage V is always at the same frequency as the resonant frequency of the tank circuit TC.

Figure 2:
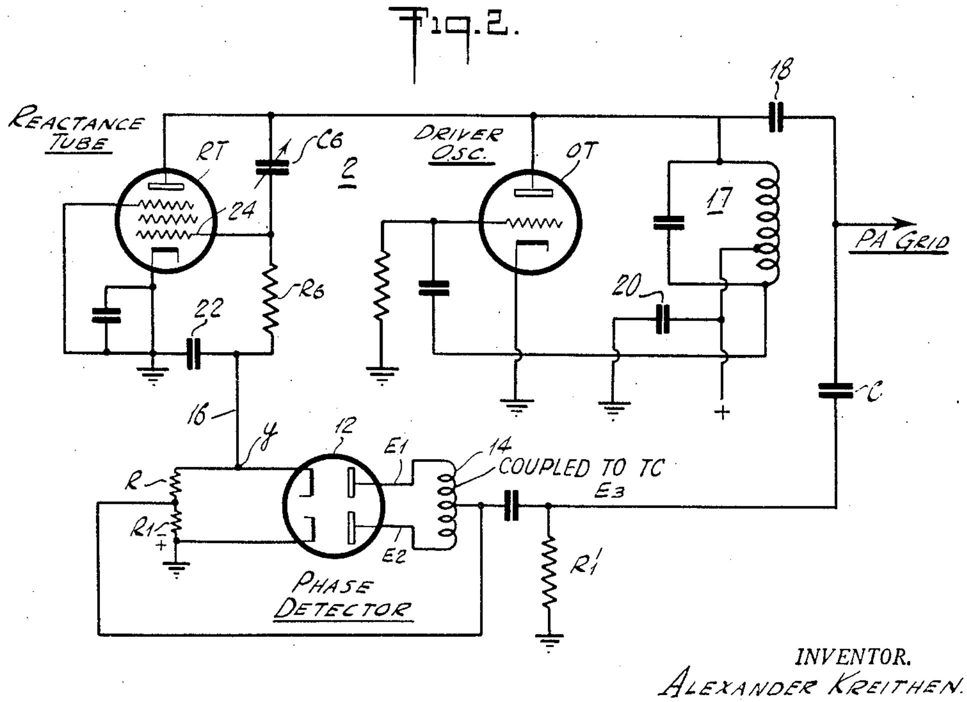

The controlled variable frequency driver may be as illustrated in Fig. 2. In this embodiment, the tube OT is in an oscillation generating circuit of any desired type, being an oscillator of the Hartley type with a tank circuit 17 in the embodiment illustrated. This oscillator output is supplied by condenser 18 to the grid of a power amplifier such as in Fig. 1. Generated voltages are also supplied as in Fig. 1 by condenser C over resistor R1', in like phase to the anodes of the double rectifier 12. Condenser C and resistor R1' shift the phase of these voltages about 90°, for the reason described hereinbefore. The inductance 14 is coupled to the power amplifier tank circuit, not shown, so that this tank circuit supplies phase opposed voltages through winding 14 to the anodes of the tube 12. The rectifier direct current paths are as described above in connection with Fig. 1. The potentials developed across resistors R and R1, when rectification takes place, oppose to provide at point Y and on lead 16 a potential of a polarity which depends on the relation between the excitation frequency of the amplifier and the tuning of its output circuit as influenced by the variable load.

The potential developed at Y is applied by lead 16 over resistor R6 to the control grid of a reactance tube RT. The reactance tube RT has its anode connected to the anode of the tube OT and to one side of the exciter tank circuit 17. The tube RT also has its cathode connected to ground and from ground through coupling and direct current blocking condenser 20 to a point on the inductance of 17, so that the impedance between the output electrodes of the reactance tube shunts a portion of the tank circuit 17. The anode of the tube RT is connected to its cathode by a radio phase shifting network including condenser C6 and resistor R6 and blocking and coupling condenser 22. The reactance of the condenser C6 is made large compared to the resistance of R6, so that the current through the circuit is determined primarily by the capacitor and the voltage on the grid 24 leads the anode voltage to provide in the tube RT, a reactive effect which depends upon the tube's conductivity or gain, which in turn depends on the potential developed and applied over lead 16 to the grid 24. The simulated reactance in the tube RT is in the frequency determining circuit 17, so that the frequency of the oscillator is controlled by the action of the phase shifter and in a direction to match the excitation voltage to the resonant frequency of the power amplifier tank circuit TC. The operation of a reactance tube of this nature is known in the art and need not be described herein in detail.

Figure 3:
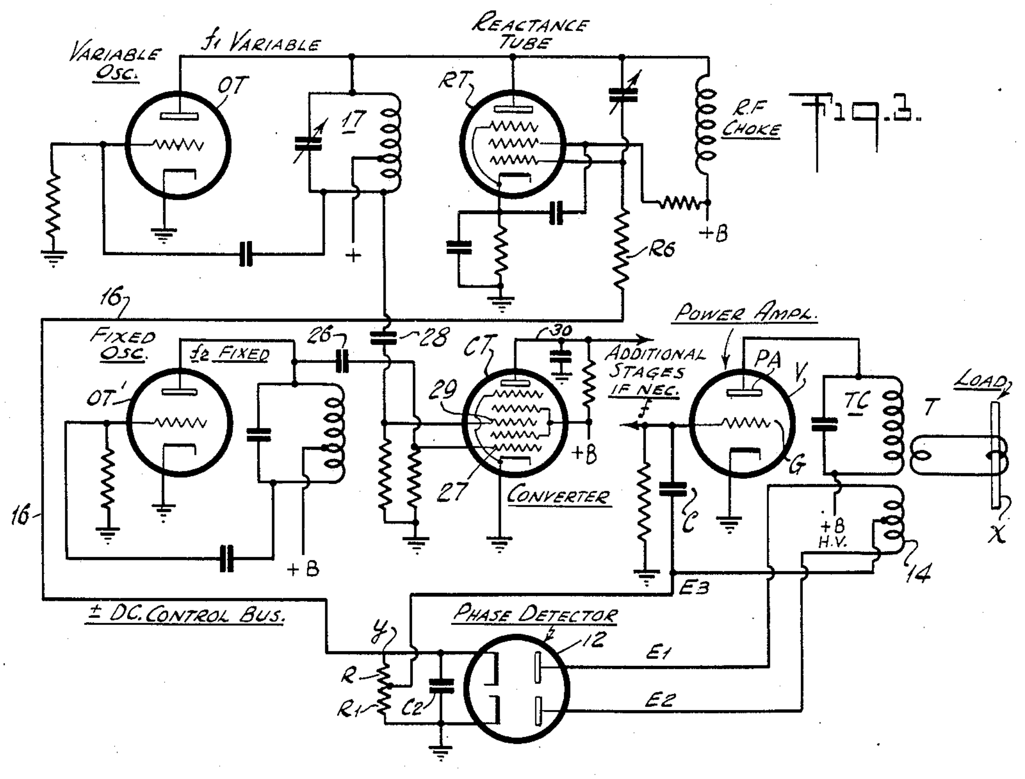

In the embodiment of Fig. 3, I use two oscillators, one of controllable frequency and the other of fixed frequency and supply output from both to a converter, so that the power amplifier is excited in this embodiment by the sum or difference frequency. In this embodiment, the phase detector and its couplings to the exciter stage output or power amplifier grid input is as illustrated in Fig. 1 and no description of the same will be given here. Reference numerals used in this embodiment correspond to those used in Fig. 1. The variable oscillator includes tube OT and may be as illustrated in Fig. 2. The same remarks apply to the reactance tube RT and a detailed description of the same will not be given here. The fixed oscillator includes the tube OT' and may be an oscillator of conventional type, being shown as of the Hartley type. This oscillator output supplies excitation by coupling condenser 26 to the first grid 27 in a converter tube CT. The converter tube CT is also excited at its grid 29 by output from the variable oscillator OT. This output is fed from the tank circuit 17 by way of coupling condenser 28. The mixer or converter tube CT supplies output by lead 30 directly to the control grid G of the power amplifier or by way of additional stages (not shown) if necessary. The automatic frequency control circuit supplies potential from the point Y over lead 16 and through resistor R5 to the control grid of the reactance tube R2 to operate as described hereinbefore to control the frequency of excitation of the power amplifier in accordance with the changes in the reactance in the tank circuit TC caused by variations in the load X being worked on.

Figure 4:
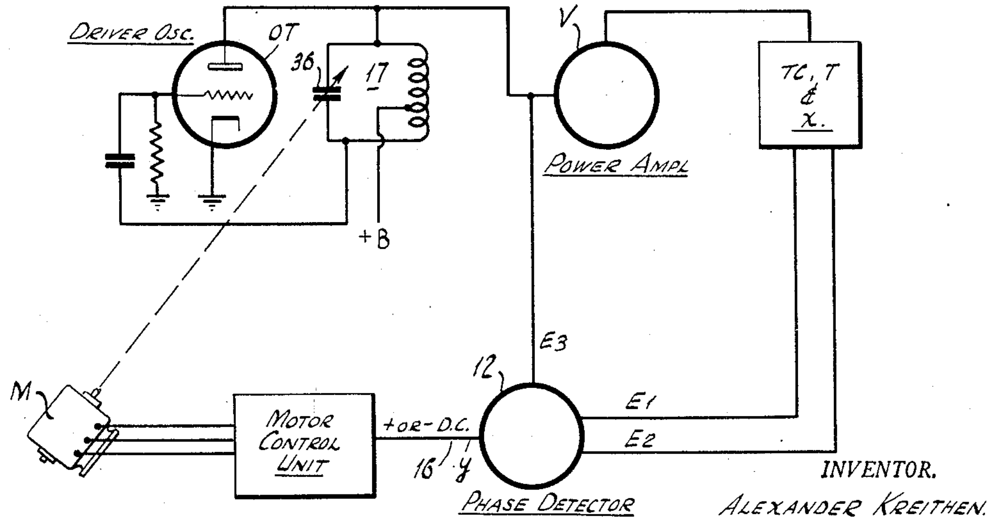

In the prior embodiments, I have shown a reactance tube means for tuning the exciter source. Motor means may be used, as known in the prior art, for this tuning purpose. Then the system may be as illustrated in Fig. 4. The power amplifier, its tank circuit and load and so forth are designated generally at V and TC and X. The phase detector is designated generally at 12. These portions of the circuit may be as described hereinbefore in connection with Figs. 1, 2 and 3. The potential at the point Y again varies about zero, as described hereinbefore, and may operate through a motor control means in a well known manner to excite one phase winding or the other of a two-phase motor M to rotate a capacitor 36 in the tank circuit 17 of the driver oscillator in one direction or the other to raise or lower the frequency of excitation of the power amplifier load to re-match the tube output to the tank circuit.

What is claimed is:

1. In apparatus for generating radio frequency power for induction heating and like industrial purposes and applying the same to objects being worked on in a work circuit the reactance of which may change, a source of oscillations, a power amplifier having input electrodes coupled to said source of oscillations to be excited thereby and having output electrodes coupled to said work circuit by a fixedly tuned coupling which matches the impedance between said output electrodes to the work circuit, and means for rematching said impedance and work circuit when variations in the work circuit reactance cause mis-matching, including a phase detector excited by the energy used to excite said input electrodes and by energy from the output of said amplifier, and tuning means in said source of oscillations controlled by potentials developed by current in said phase detector, whereby the source frequency follows the frequency at which said fixed tuned coupling resonates.

2. In apparatus for generating high frequency power for industrial purposes and applying the same to a load being worked on, a source of oscillations of controllable frequency, a power amplifier having input electrodes coupled to said source and having output electrodes, tuned transformer means coupling said output electrodes to said work load, and means for re-tuning said source of oscillations when variations in the work reactance change the resonant frequency of said tuned transformer, including a phase detector excited by energies extracted from the source of oscillations and from the output of said amplifier, and tuning means in the source controlled by potentials developed by current in said phase detector.

3. In apparatus for generating radio frequency power for industrial heating and the like purposes and applying the same to work objects the reactance of which may change, two oscillation generators, one of which is of controllable frequency, a mixer coupled to said oscillation generators, an amplifier having input electrodes coupled to the output of said mixer and having output electrodes, a fixedly tuned coupling between said output electrodes and said work, and means for changing the frequency of the energy supplied to the amplifier from the mixer when variations in the work reactance change the resonant frequency of said tuned coupling, including a phase detector excited by energy appearing in the output of said mixer and by energy appearing in the output of said amplifier, and tuning means in the generator of controllable frequency, controlled by potentials developed by current in said phase detector.

ALEXANDER KREITHEN.

REFERENCES CITED

The following references are of record in the file of this patent:

UNITED STATES PATENTS

| Number | Name | Date |
|---|---|---|
| 2,233,165 | Goldman | Feb. 25, 1941 |
| 2,396,004 | Gilbert | Mar. 5, 1946 |

FOREIGN PATENTS

| Number | Country | Date |
|---|---|---|
| 411,217 | Great Britain | June 7, 1934 |